US006561894B1

(12) United States Patent
Miyajima

(10) Patent No.: US 6,561,894 B1
(45) Date of Patent: *May 13, 2003

(54) CLEAN BOX, CLEAN TRANSFER METHOD AND APPARATUS THEREFOR

(75) Inventor: Toshihiko Miyajima, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/294,007

(22) Filed: Apr. 19, 1999

(51) Int. Cl.[7] .................................................. B01L 1/04
(52) U.S. Cl. ...................................... 454/187; 454/195
(58) Field of Search ................................ 454/187, 195; 414/939, 937, 940, 684.3

(56) References Cited

U.S. PATENT DOCUMENTS

| | | | |
|---|---|---|---|
| 4,227,922 A | * 10/1980 | Laws et al. ................. | 75/10.67 |
| 4,636,128 A | 1/1987 | Millis et al. | |
| 4,652,135 A | 3/1987 | Ono | |
| 4,683,761 A | 8/1987 | Stock | |
| 5,080,248 A | 1/1992 | Stocchiero | |
| 5,139,459 A | 8/1992 | Takahashi et al. | |
| 5,316,733 A | 5/1994 | Rune et al. | |
| 5,364,219 A | 11/1994 | Takahashi et al. | |
| 5,398,481 A | * 3/1995 | Takeuchi et al. .............. | 53/405 |
| 5,472,086 A | 12/1995 | Holliday et al. | |
| 5,562,383 A | 10/1996 | Iwai et al. | |
| 5,609,459 A | 3/1997 | Muka | |
| 5,638,971 A | * 6/1997 | Justesen ...................... | 141/65 |
| 5,730,573 A | 3/1998 | Masujima et al. | |
| 6,168,364 B1 | 1/2001 | Miyajima | |

FOREIGN PATENT DOCUMENTS

JP         63-28047        2/1988
JP         63-190338       8/1988
JP         7-235580        9/1995
JP         2525284         5/1996

(List continued on next page.)

OTHER PUBLICATIONS

U.S. application No. 09/473,946 filed Dec. 29, 1999, pending.
U.S. application No. 09/294,005 filed Apr. 19, 1999, pending.
U.S. application No. 09/294,006 filed Apr. 19, 1999, pending.
U.S. application No. 09/294,008 filed Apr. 19, 1999, pending.

Primary Examiner—Denise L. Ferensic
Assistant Examiner—Jiping Lu
(74) Attorney, Agent, or Firm—Oblon, Spivak, McClelland, Maier & Neustadt, P.C.

(57) ABSTRACT

Using a clean box 30 which includes a box body 31 having an annular groove 33 for suction surrounding a side aperture 32 and an intake/exhaust port 34 in communication therewith, a side lid 35 for closing the aperture 32 while being sucked by a pressure difference between inside and outside a space S for suction formed by the annular groove 33 for suction, and an additional lid 36 for closing the intake/exhaust port 34 by a pressure difference between inside and outside thereof, the clean box 30 is connected to a gate aperture 42 of a clean room 40, a vacuum changer 50 evacuates a hermetically closed space outside the box body including the additional lid 36 to cancel the pressure difference between inside and outside of the additional lid 36 and opens the intake/exhaust port 34 to turn the space S for suction into the atmospheric pressure, the side lid 35 is drawn into the clean room 40 to establish communication between the clean box and the inside of the clean room, and objects to be transferred are then transferred between the clean box and the clean room.

14 Claims, 6 Drawing Sheets

FOREIGN PATENT DOCUMENTS

| | | |
|---|---|---|
| JP | 9-246351 | 9/1997 |
| JP | 2722306 | 11/1997 |
| JP | 10-56050 | 2/1998 |
| JP | 2757102 | 3/1998 |
| JP | 2137951 | 8/1998 |
| JP | 2850279 | 11/1998 |
| JP | 10-321695 | 12/1998 |
| JP | 10-321696 | 12/1998 |

* cited by examiner

CLEAN BOX, CLEAN TRANSFER METHOD AND APPARATUS THEREFOR

BACKGROUND OF THE INVENTION

1. Field of the Invention

The present invention relates to a clean box constructed in such structure that objects to be transferred, necessary for fabrication processes of semiconductors, electron-device-associated products, optical disks, etc., can be transferred in a sealed state with a clean gas containing no contaminants and, particularly, in such structure that the objects to be transferred are carried through a side aperture into or out of the box, and also relates to a clean transfer method and apparatus using this clean box.

2. Related Background Art

Transfer boxes using the mechanical seal as illustrated in FIG. 6 have been used heretofore for transferring semiconductor wafers or the like.

The assignee of the present invention suggested a clean transfer method for transferring the objects to be transferred, in a vacuum clean box in a vacuum-sealed state in Japanese Laid-open Patent Application No. 7-235580. In this case, the vacuum clean box is composed of a box body having an aperture in a bottom surface and a bottom lid also serving as a shutter for hermetic sealing, and a closed state thereof is maintained in such a way that the bottom lid is urged against the box body by a pressure difference between inside and outside the box (the inside of the box being a vacuum and the outside the atmospheric pressure). In cases where the transfer is carried out while the inside of the clean box is filled with a clean gas such as nitrogen or the like, the above structure cannot maintain the closed state of the bottom lid without any aid, because there is no pressure difference between inside and outside the box.

The assignee of the present invention thus suggested in Japanese Laid-open Patent Application No. 10-56050 a clean box that permitted the objects to be transferred in the sealed state with the clean gas, without use of the mechanical seal.

The clean box of the clean gas sealing type suggested in Japanese Laid-open Patent Application No. 10-56050 is illustrated in FIG. 5. In this figure, the clean box 1 has a box body 2 having an aperture in the bottom surface, a bottom lid 3 for hermetically closing the aperture of the bottom surface and also serving as a shutter, and a lid chuck 4 of an L-shaped cross section and an annular shape for adhering under vacuum to the box body 2 and lid 3 and maintaining the lid 3 in the closed state, but has neither evacuation means nor transfer means. A holder 5 is attached to the bottom lid 3 and supports the objects 6 to be transferred, for example, in a multiply stacked state in the clean box 1.

In this case of FIG. 5, an inside space K of the lid chuck 4 is kept in a vacuum-evacuated state, whereby the lid chuck 4 maintains the bottom lid 3 in a pressed state against the box body 2 by the pressure difference between inside and outside. This structure allows the bottom lid 3 to be maintained in the closed state even if the inside of the clean box 1 is filled with the clean gas of the atmospheric pressure.

Incidentally, the clean box 1 of FIG. 5 is of the bottom opening/closing type, in which vertical motion as indicated by an arrow A is essential to the operation of carrying the objects 6 into or out of the box. This involves change in the height of the objects 6 from the floor surface, so that the excess vertical motion is required, in addition to the horizontal motion for interface with various processing devices. In addition, a vacuum changer having an evacuation function is used for attachment/detachment of the bottom lid 3 and lid chuck 4 to or from the box body 2 and for a process for depressurizing the inside space K of the lid chuck 4 into a vacuum in connection with the attachment, and vertical motion thereof is necessary for carrying the objects 6 into or out of the box. This poses a problem that the placement height of the clean box 1 on the vacuum changer also becomes high.

Further, the vacuum changer needed to have mechanisms capable of moving the bottom lid 3 and the lid chuck 4 up and down independently of each other, so that the structure of the vacuum changer tended to become complicated.

Meanwhile, standardization of the transfer boxes for semiconductors is under way in EIAJ (J300). The transfer boxes heretofore were of the type of taking the semiconductor wafers out of the bottom side of the box, but a laterally drawing method is being determined as a standardized method for the reason that the placement height of the box is high in the bottom opening/closing type. For example, the transfer box 20 for semiconductors of FIG. 6 suggested at present is also of the side open type having an aperture 21 in a side surface. This box, however, still leaves us the following challenges because of the mechanical seal; (1) a complex mechanism is necessary and sufficient reliability cannot be assured; (2) holding power sufficient for practical use cannot be obtained because of utilization of the mechanical holding power of springs or the like.

SUMMARY OF THE INVENTION

A first object of the present invention is, in view of the above points, to provide a clean box that does not have to use the conventional mechanical seal with the springs or the like even in the structure of the side open type, that can transfer or store the objects to be transferred in a sealed state with a clean gas, and that has simple structure.

A second object of the present invention is to provide a clean transfer method and apparatus capable of transferring the objects to be transferred in the sealed state with the clean gas, using the clean box of the side open type in the simple structure without use of the mechanical seal.

The other objects and novel features of the present invention will become apparent in the description of the embodiment hereinafter.

For accomplishing the above objects, a clean box of the present invention comprises a box body, said box body having an aperture in one side surface, an annular groove for suction formed in said one side surface so as to surround the aperture, and an intake/exhaust port in communication with said annular groove for suction in another surface; a side lid arranged to hermetically cover said annular groove for suction to form a space for suction while being mounted on the box body, said side lid being sucked to the box body by a pressure difference between inside and outside the space for suction to hermetically close said aperture; and an additional lid for hermetically closing said intake/exhaust port by a pressure difference between inside and outside thereof, the clean box itself having neither evacuation means nor transfer means.

A clean transfer method of the present invention is a clean transfer method using a clean box comprising a box body, said box body having an aperture in one side surface, an annular groove for suction formed in said one side surface so as to surround the aperture, and an intake/exhaust port in communication with said annular groove for suction in another surface; a side lid arranged to hermetically cover said annular groove for suction to form a space for suction while being mounted on the box body, said side lid being sucked to the box body by a pressure difference between inside and outside the space for suction to hermetically close said aperture; and an additional lid for hermetically closing said intake/exhaust port by a pressure difference between inside and outside thereof, said clean transfer method comprising steps of hermetically connecting said clean box to a gate aperture of a clean device, the gate aperture being formed in a side wall surface of the clean device and being hermetically closed by a gate valve; evacuating a hermetically closed space outside the box body, including said additional lid, by a vacuum changer to cancel the pressure difference between inside and outside of said additional lid and opening said intake/exhaust port to turn said space for suction into the atmospheric pressure through said intake/exhaust port; thereafter drawing the side lid into said clean device while holding said side lid by said gate valve to establish communication between an inside space of said clean box and the inside of said clean device; and transferring objects to be transferred between said clean box and said clean device.

The clean transfer method can be arranged in such a manner that from the communication state between the inside space of said clean box and the inside of said clean device said side lid is held by said gate valve so as to hermetically close said aperture, thereafter said space for suction is evacuated through said intake/exhaust port by said vacuum changer, thereafter said intake/exhaust port is hermetically closed by said additional lid, and the hermetically closed space outside the box body, including said additional lid, is turned into the atmospheric pressure, whereby the side lid and additional lid can be mounted on the box body.

Further, a clean transfer apparatus of the present invention is a clean transfer apparatus comprising:

a clean box comprising a box body, said box body having an aperture in one side surface, an annular groove for suction formed in said one side surface so as to surround the aperture, and an intake/exhaust port in communication with said annular groove for suction in another surface; a side lid arranged to hermetically cover said annular groove for suction to form a space for suction while being mounted on the box body, said side lid being sucked to the box body by a pressure difference between inside and outside the space for suction to hermetically close said aperture; and an additional lid for hermetically closing said intake/exhaust port by a pressure difference between inside and outside thereof;

a clean device having a gate aperture formed in a side wall surface thereof and a gate valve capable of opening or closing said gate aperture and capable of holding the side lid of the clean box connected to the gate aperture; and a vacuum changer for evacuating a hermetically closed space outside the box body, including the additional lid of the clean box connected to said gate aperture, wherein in a state in which said vacuum changer cancels the pressure difference between inside and outside of said additional lid and opens said intake/exhaust port to turn said space for suction into the atmospheric pressure through said intake/exhaust port, said side lid is drawn into said clean device while being held by said gate valve, to establish communication between an inside space of said clean box and the inside of said clean device.

The clean transfer apparatus may also be so constructed that said vacuum changer has a box holding member constructed in such structure that a vacuum suction passage for suction of said box body is formed in an opposite surface thereof to said box body and that said hermetically closed space is formed inside said box holding member.

Further, the clean transfer apparatus may also be so constructed that said vacuum changer has a lid receiver for receiving said additional lid separated from said box body, inside said box holding member, said lid receiver being movable.

The clean box according to the present invention has neither the evacuation means, e.g., a vacuum pump for evacuating the inside of the box or only the lid portions (the side lid and additional lid) of the box and other valves, pipes, etc. forming an evacuation system, nor the transfer means for transferring the box itself.

DETAILED DESCRIPTION OF THE PREFERRED EMBODIMENTS

Figure 1:
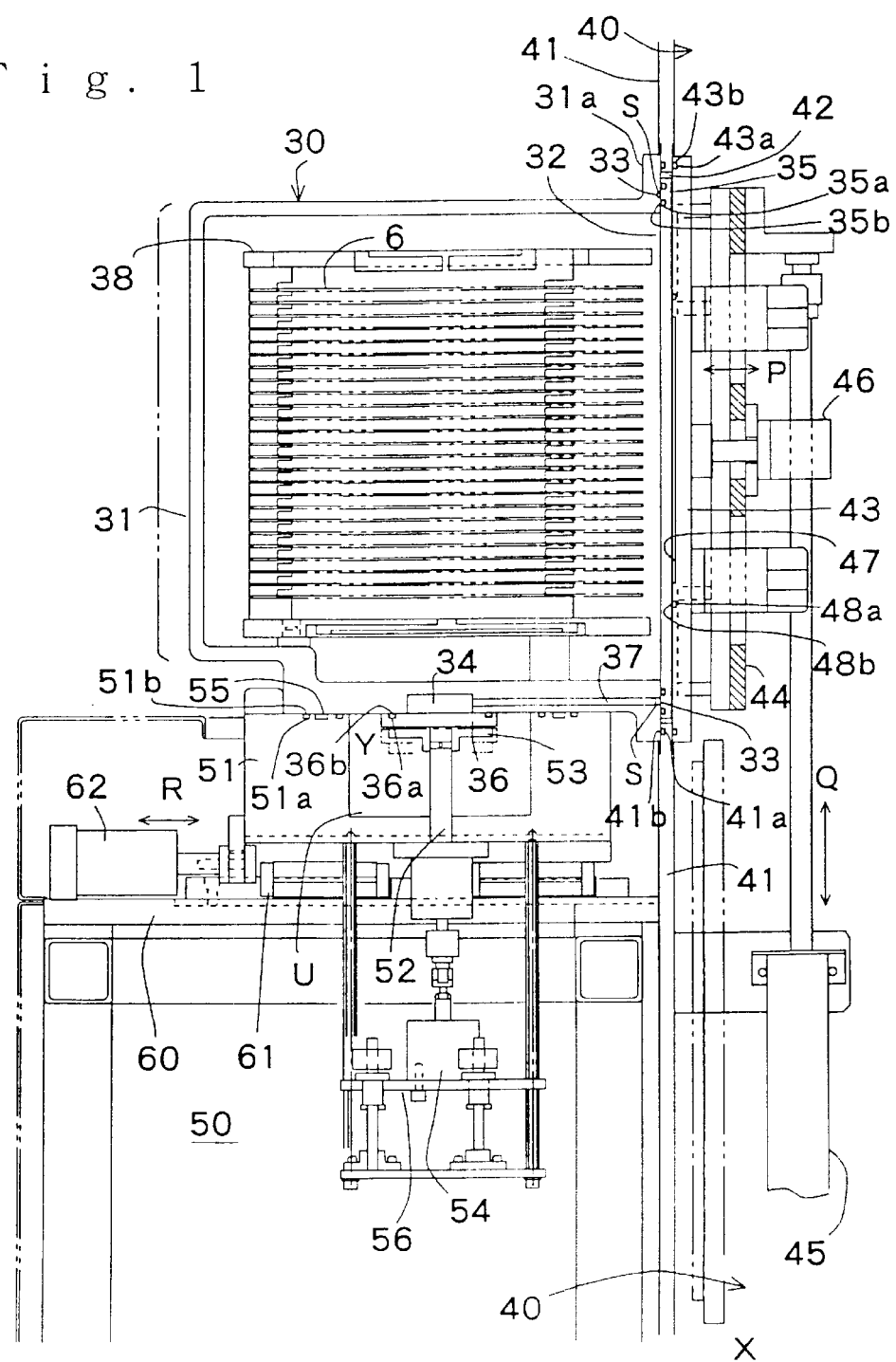
FIG. 1 is a front sectional view to show an embodiment of the present invention in a connection preparation stage for connection between the clean box and the clean room, in which the clean box is mounted on the vacuum changer.

Embodiments of the clean box and the clean transfer method and apparatus according to the present invention will be described below referring to the drawings.

In FIG. 1 to FIG. 4, the clean box 30 is comprised of a box body 31 having a side aperture 32 in one side surface and an annular groove 33 for suction surrounding the side aperture 32 in the same side surface and also having an intake/exhaust port 34 in communication with the annular groove 33 for suction in a bottom surface, a side lid 35 for creating a space S for suction while hermetically covering the annular groove 33 for suction in a mounted state of the side lid 35 on the box body 31 and for hermetically closing the side aperture 32 while being sucked to the box body 31 by the pressure difference between inside and outside the space S for suction, and an additional lid 36 for hermetically closing the intake/exhaust port 34 by the pressure difference between inside and outside, it secures airtightness enough to maintain a clean state during closing of the side lid 35 and the additional lid 36, and it has neither evacuation means nor transfer means.

There is a side flange portion 31a around the side aperture 32 of the box body 31 and the annular groove 33 for suction is formed so as to make a round in an opposite surface of the side flange portion 31a to the side lid (i.e., in a joint surface to the side lid). The annular groove 33 for suction and the intake/exhaust port 34 are connected by an intake/exhaust passage 37 formed inside a thick part of the box body 31. For assuring airtightness, an annular groove 35a is formed at each of positions for hermetically sealing the inside and outside of the annular groove 33 for suction in the opposite surface of the side lid 35 in contact with the side flange portion 31a of the box body 31, and an O-ring 35b for hermetic sealing is fitted in each of the annular grooves 35a. For assuring airtightness, an annular groove 36a is also formed in an opposite surface of the additional lid 36 in contact with the peripheral part of the intake/exhaust port 34 and an O-ring 36b for hermetic sealing is disposed in the annular groove 36a.

A holder 38 for supporting the objects 6 to be transferred, such as the semiconductor wafers or the like, is attached in the box body 31. The holder 38 is constructed, for example, in such structure that many objects 6 to be transferred can be stored at equal intervals in a horizontal state.

A clean room 40 has a gate aperture (exit/entrance) 42 in its side wall 41 in order to allow the objects 6 such as the semiconductor wafers or the like to be carried thereinto by use of the clean box 30 or allow the objects 6 to be carried out therefrom into the clean box 30. This gate aperture 42 is of a structure capable of being opened or closed by a gate valve 43. Namely, the gate valve 43 is attached to a vertical plate-like up-and-down member 44 provided behind it so as to be movable in parallel horizontally (in directions along the arrow P), and the up-and-down member 44 is driven up and down in directions along the arrow Q by a pneumatic cylinder 45. The gate valve 43 is laterally driven by a pneumatic cylinder 46 attached to the up-and-down member 44 (i.e., it is driven so as to close or open the gate aperture 42). For assuring airtightness, an annular groove 43a is formed in an opposite surface of the gate valve 43 in contact with the peripheral part of the gate aperture 42, and an O-ring 43b for hermetic sealing is provided in the annular groove 43a.

As illustrated in FIG. 1, when the cylinder 46 is stretched at the up position of the up-and-down member 44 where the cylinder 45 is stretched, the gate valve 43 is pressed against the inside peripheral part of the side wall 41 having the gate aperture 42, thereby hermetically closing the gate aperture 42. After the cylinder 46 is retracted at the up position of the up-and-down member 44 to separate the gate valve 43 from the gate aperture 42 and when the cylinder 45 is retracted to move the up-and-down member 44 down, the gate valve 43 is moved down to the position X of FIG. 2, whereby the gate aperture 42 can be opened.

A suction recess 47 for vacuum suction of the side lid 35 on the clean box 30 side is formed in the gate valve 43, an annular groove 48a is formed around the suction recess 47, and an O-ring 48b for hermetic sealing is provided in the annular groove 48a.

There is a vacuum changer 50 (with evacuation means) provided for evacuating the inside of the annular groove 33 for suction through the intake/exhaust port 34 for the purpose of vacuum suction of the side lid 35 to the box body 31 of the clean box 30 or for returning the inside of the groove to the atmospheric pressure (normally, the vacuum changer 50 being disposed at a position outside the clean room 40 and below the gate aperture 42), and this vacuum changer 50 has a cup-shape mount stage 51 as a box holding member for holding the clean box 30 at a height where the clean box 30 can be connected to the gate aperture 42 of the clean room 40, the mount stage 51 being slidable in horizontal directions (in directions along the arrow R). Namely, the cup-shape mount stage 51 is attached via a lateral slider 61 to a fixed base 60 of the vacuum changer 50, so that the mount stage 51 can be moved toward or away from the side wall 41 of the clean room 40 with a stretching or retracting operation of a pneumatic cylinder 62 mounted on the fixed base 60 for lateral movement of the mount stage.

A lid receiver 53 for supporting the additional lid 36 separated from the box body 31 is fixed to an upper end of an up-and-down shaft 52 vertically penetrating the inside central part of the cup-shape mount stage 51. A pneumatic cylinder 54 for driving the up-and-down shaft 52 fixed to the lid receiver 53 up and down is fixed to a fitting plate 56 supported on the side of the cup-shape mount stage 51, and a piston rod of the pneumatic cylinder 54 is connected to the up-and-down shaft 52.

An annular groove 55 for vacuum suction of the bottom surface of the clean box 30 is formed in a clean box mount surface of the cup-shape mount stage 51, an annular groove 51a for assuring airtightness is formed in each of the inside and outside of this annular groove 55 for suction, and an O-ring 51b for hermetic sealing is fitted in each of the annular grooves 51a.

For assuring airtightness, an annular groove 41a surrounding the gate aperture 42 is formed in the outside, opposite surface of the side wall 41 in contact with the side flange portion 31a of the clean box 30 (the peripheral part of the side aperture 32), and an O-ring 41b for hermetic sealing is fitted in the annular groove 41a.

The operation of this embodiment will be described next.

Figure 4:
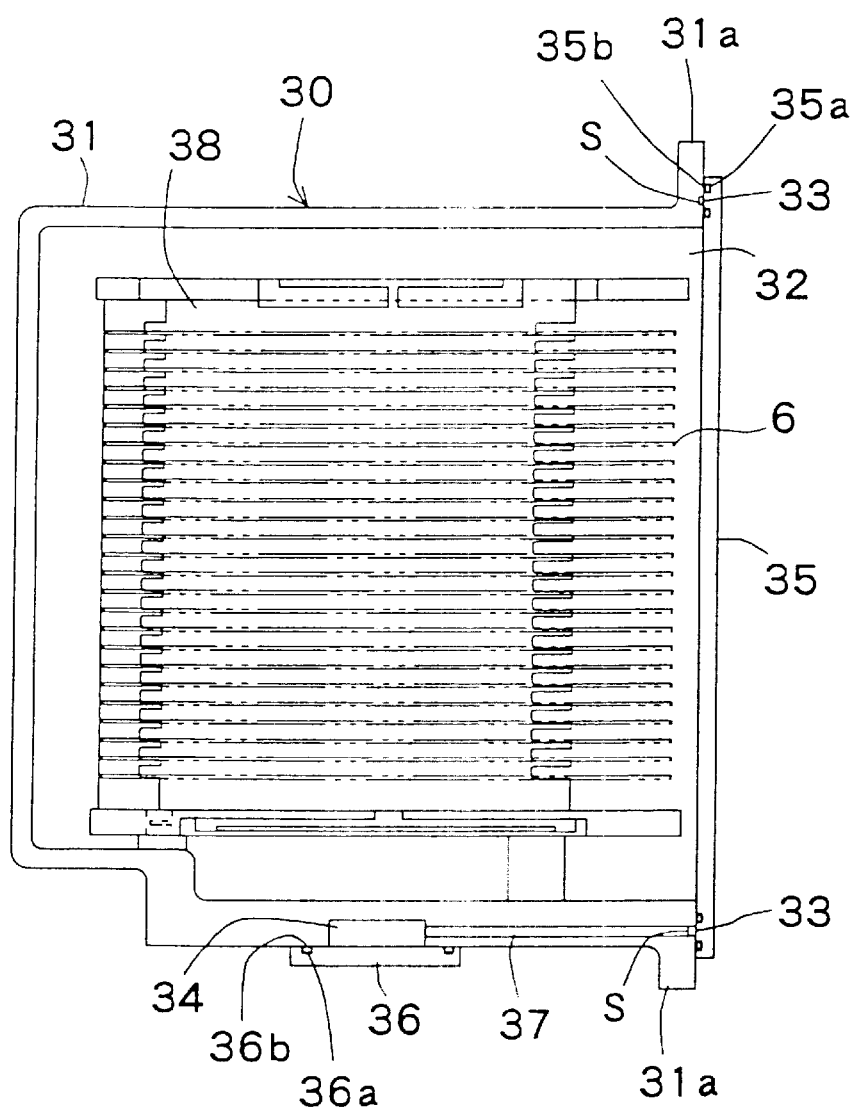
FIG. 4 is a front sectional view to show the clean box in a separated state.

As illustrated in FIG. 4, the clean box 30 stores the objects 6 to be transferred, such as the semiconductor wafers or the like, in the sealed state with the clean gas such as nitrogen or the like. In a state in which the space S for suction, which is formed while the annular groove 33 of the side flange portion 31a is hermetically covered by the side lid 35, is depressurized in a vacuum, the side lid 35 and additional lid 36 hermetically close the side aperture 32 and the intake/exhaust port 34 by the pressure difference between inside and outside (or between the vacuum inside the annular groove 33 and the intake/exhaust port 34 and the atmospheric pressure outside the clean box). In this state the clean box 30 is free to transfer or store the objects 6 to be transferred.

When the objects 6 to be transferred are transferred between the clean box 30 and the clean room 40, the clean box 30 is mounted on the cup-shape mount stage 51 of the vacuum changer 50, as illustrated in FIG. 1, and the bottom surface of the clean box 30 (box body 31) is sucked to and held on the cup-shape mount stage 51 by vacuum suction of the annular groove 55 for suction. In this held state of the clean box 30, the pneumatic cylinder 62 is stretched to move the cup-shape mount stage 51 toward the side wall 41, whereby the side flange portion 31a of the box body 31 becomes hermetically pressed against the outside surface of the side wall 41 in the peripheral part of the gate aperture 42. At this time, as illustrated in FIG. 1, the side lid 35 moves into the gate aperture 42 to go into close fit to the gate valve 43 hermetically closing the gate aperture 42. In addition, vacuum suction of the suction recess 47 on the gate valve 43 side is effected to suck and hold the side lid 35 on the side of the gate valve 43, too.

The inside space U of the cup-shape mount stage 51, the upper surface of which is hermetically closed by the clean box 30, is evacuated to the vacuum to cancel the pressure difference between inside and outside the additional lid 36 (the inside of the intake/exhaust port 34 and the inside space U both becoming vacuum), whereupon the additional lid 36 turns into a state in which it can drop because of its weight. After that, the up-and-down shaft 52 to which the lid receiver 53 is fixed is lowered by the pneumatic cylinder 54 to take the additional lid 36 together with the lid receiver 53 down to the position Y of the fictitious lines of FIG. 1, whereupon the intake/exhaust port 34 on the bottom surface side of the box body 31 is opened.

Next, the inside space U of the cup-shape mount stage 51 is made to leak with the clean gas such as clean air, nitrogen, or the like to return the inside space U, the intake/exhaust port 34 on the clean box 30 side in communication therewith, and the inside of the annular groove 33 in communication therewith to the atmospheric pressure. This releases the vacuum suction of the side lid 35 (i.e., the annular groove 33 for suction turns into the atmospheric pressure, similar to the clean room 40), whereupon the side lid 35 turns into a state in which it is sucked and held by only the gate valve 43. Then the pneumatic cylinder 46 is retracted to move the gate valve 43 away from the gate aperture 42 and then the pneumatic cylinder 45 is retracted to move the up-and-down member 44 down, whereupon the gate valve 43 is moved down to the position X of FIG. 2 to draw the side lid 35 into the clean room 40, thereby opening the gate aperture 42. In this state of FIG. 2, the inside of the clean box 30 and the clean room 40 create a continuous space and, therefore, the objects 6 to be transferred, such as the semiconductor wafers or the like, can be taken out of the holder 38 in the clean box 30 while being horizontally transferred using a carry robot or the like set inside the clean room 40.

Figure 2:
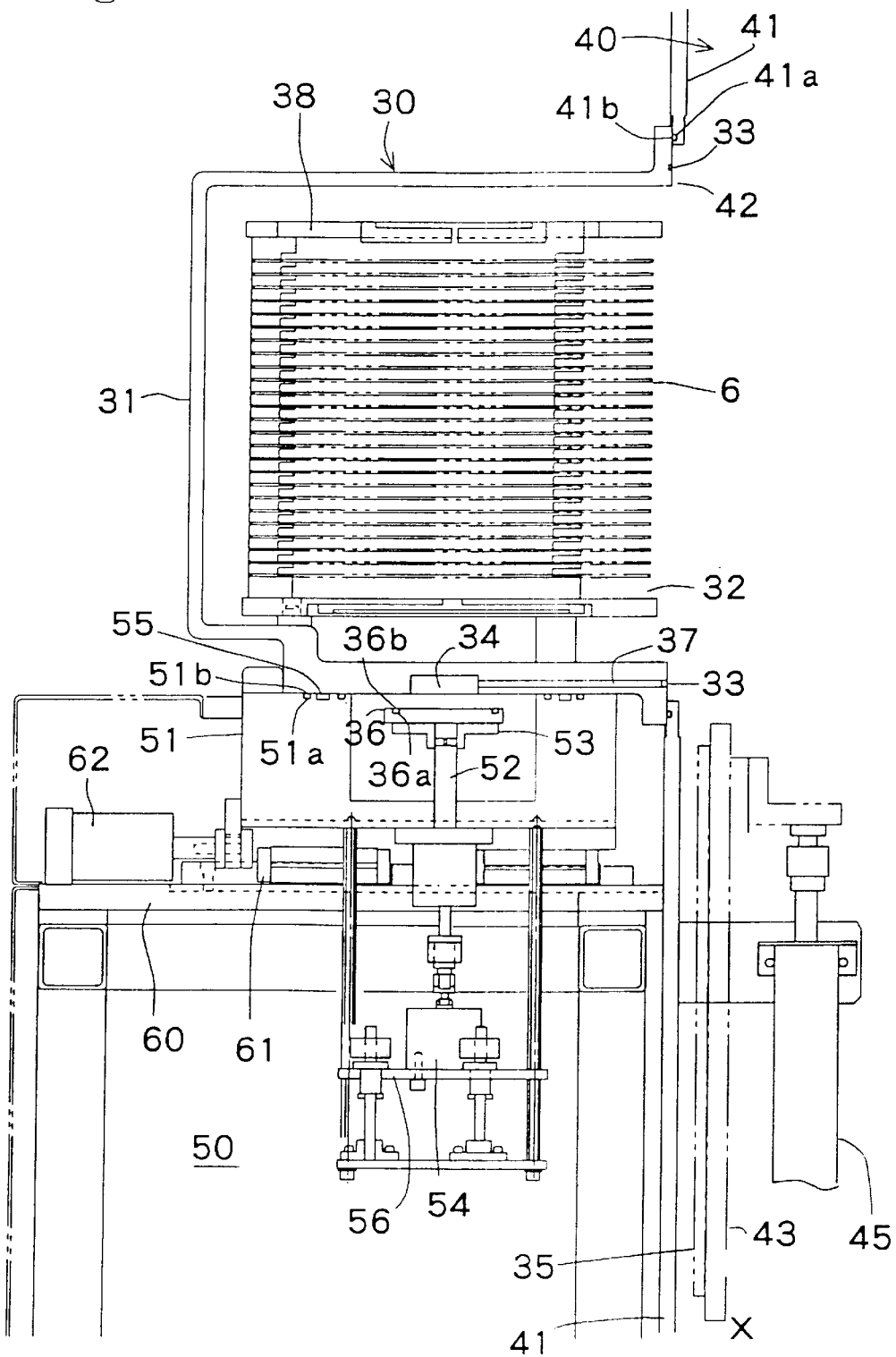
FIG. 2 is a front sectional view of the embodiment to show a state in which the clean box is connected to the clean room and their inside spaces are in communication with each other.
Figure 3:
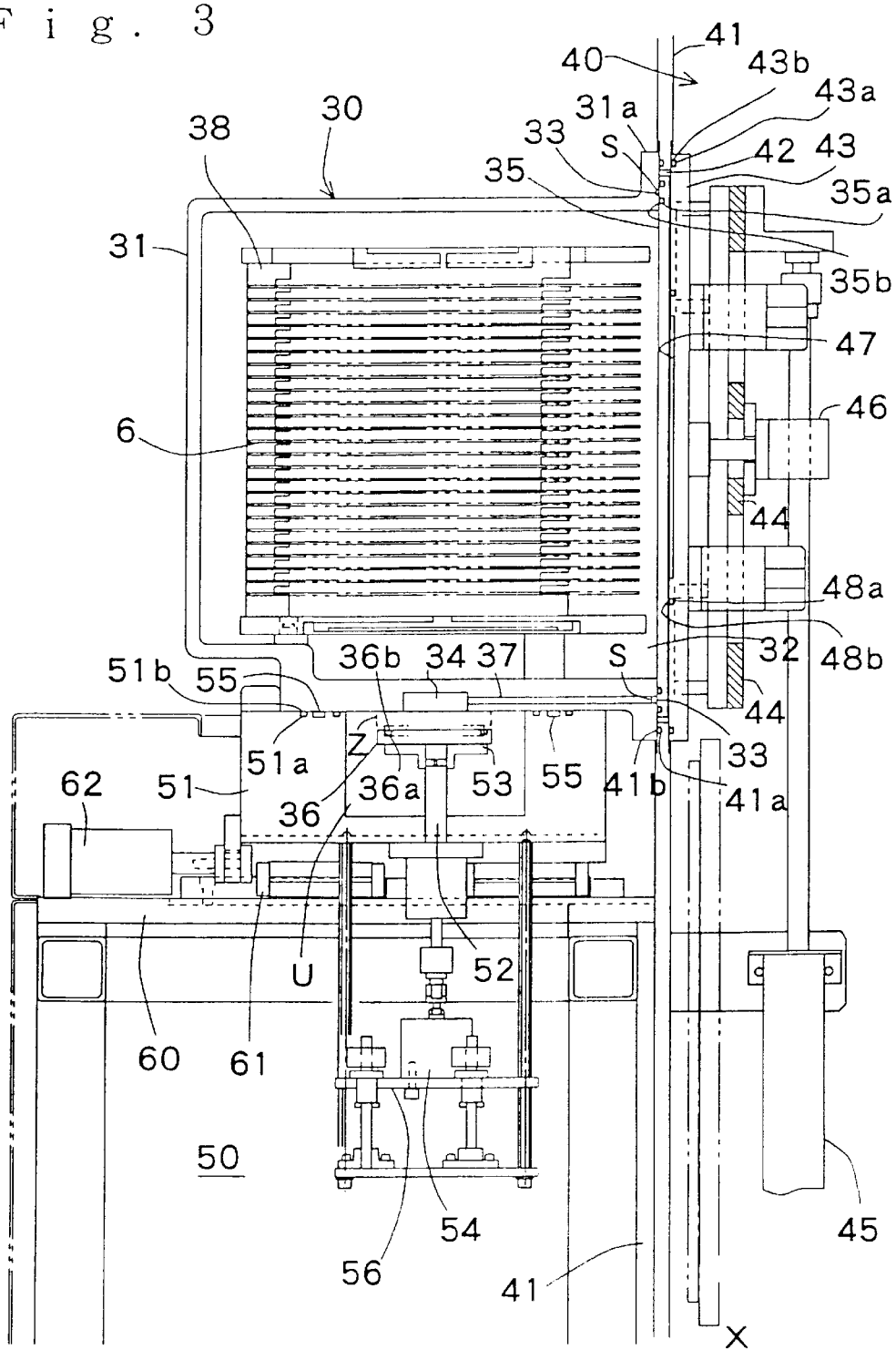
FIG. 3 is a front sectional view of the embodiment to show a separation preparation stage for separation of the clean box from the clean room, in which the clean box is mounted on the vacuum changer.

Conversely, the objects 6 to be transferred can also be horizontally transferred in order into the holder 38 in the clean box 30 in the vacant state of FIG. 2 with the carry robot or the like on the clean room 40 side. After the desired number of objects 6 are stored in the clean box 30, the cylinder 45 is stretched to move the up-and-down member 44 up to the up position, as illustrated in FIG. 3, and then the cylinder 46 is stretched to press the gate valve 43 against the inside peripheral part of the side wall 41 having the gate aperture 42 to hermetically close the gate aperture 42 and press the side lid 35 under vacuum suction by the gate valve 43 against the side flange portion 31a of the box body 31. In the state in which the side aperture 32 of the clean box 30 is hermetically closed by the side lid 35, the inside space U of the cup-shape mount stage 51 and the inside of the annular groove 33 for suction on the clean box 30 side (the inside of the suction space S) are evacuated through the intake/exhaust port 34. After completion of the evacuation, the lid receiver 53 with the additional lid 36 thereon is moved up by the pneumatic cylinder 54 to press the additional lid 36 against the bottom surface of the box body 31, as indicated by the fictitious lines Z of FIG. 3, to hermetically close the intake/exhaust port 34. After that, the inside space U of the cup-shape mount stage 51 is made to leak with the clean gas such as the clean air, nitrogen, or the like to return the inside space U to the atmospheric pressure. Since this turns the inside of the annular groove 33 and the intake/exhaust port 34 on the clean box 30 side into the vacuum and the outside thereof into the atmospheric pressure, the side lid 35 and additional lid 36 hermetically seal the side aperture 32 and the intake/exhaust port 34 with certainty by the pressure difference between inside and outside even without the mechanical seal mechanism. When the suction of the side lid 35 by the gate valve 43 is released thereafter, the box becomes free to transfer, as illustrated in FIG. 4, and thus the clean box 30 can be transferred to an arbitrary position by an automatic guided vehicle or the like.

The embodiment described above has the following effects.

(1) Since the side lid 35 undergoes the vacuum suction in such structure that the annular groove 33 for suction, which can be evacuated through the intake/exhaust port 34 located in one surface except for the aperture surface, is formed in the aperture end surface of the box body 31 of the clean box 30, the side aperture 32 for taking-out of the objects to be transferred can be hermetically closed by the side lid 35 while the intake/exhaust port 34 by the additional lid 36, without use of the mechanical seal. This can realize the side open type structure without use of the mechanical seal employed in the conventional products and overcome the drawbacks in use of the mechanical seal, by the extremely simple configuration.

(2) Since the clean box 30 is of the side open type, the objects 6 to be transferred can be moved horizontally and transferred in the connected state of the clean box 30 to the clean room 40. This obviates the need for the excess motion for the interface with various processing devices. Since the clean box 30 uses no mechanical seal, connection or disconnection thereof is also easy to or from the gate aperture 42 of the clean room 40.

(3) Since the clean box 30 is of the side open type, it does not require the vertical motion, which was required in the conventional structure in which the objects to be transferred were taken out from the bottom surface of the clean box, the placement position of the clean box 30 with respect to the vacuum changer 50 does not have to be set high, and the clean box 30 can be preliminarily set at the height suitable for the operation in the clean room 40.

Figure 5:
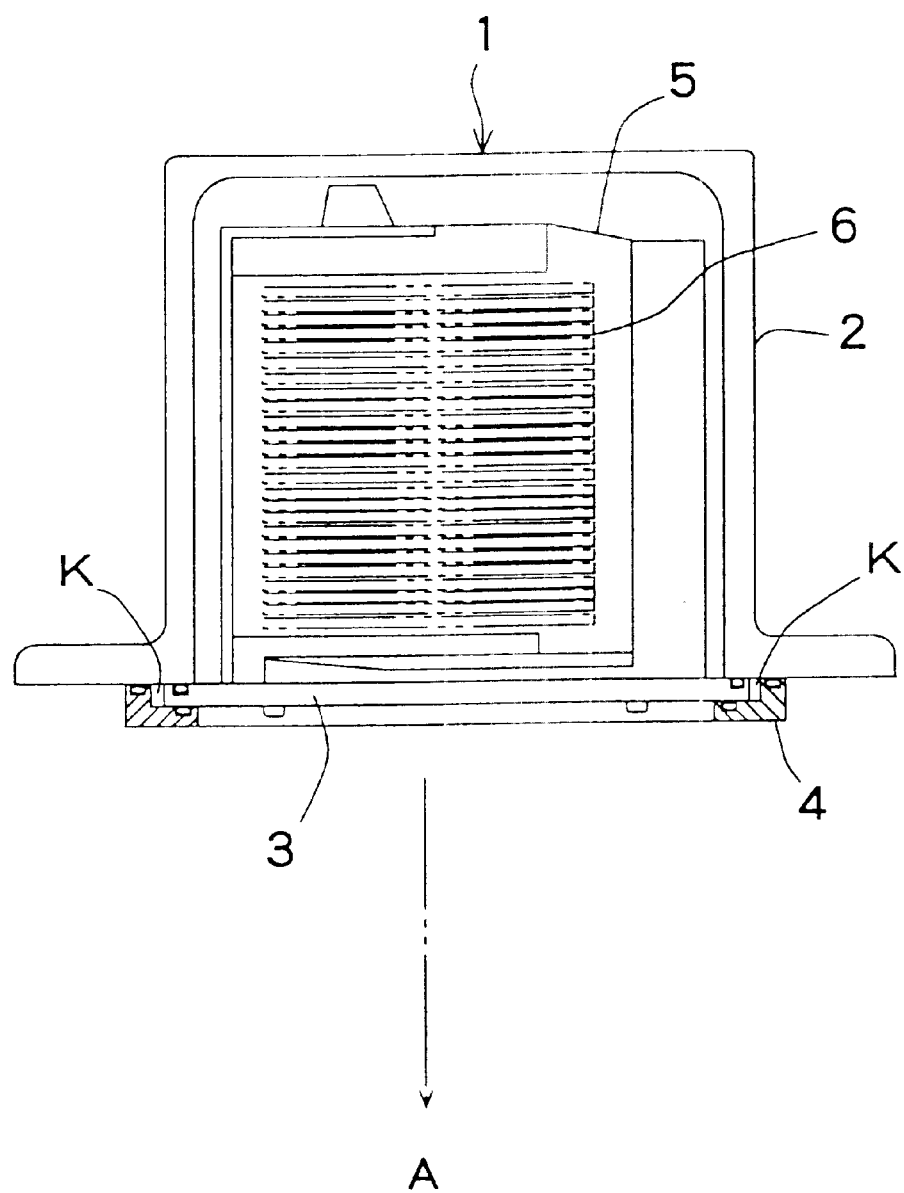
FIG. 5 is a front sectional view to show the conventional clean box of the clean gas sealing type.
Figure 6:
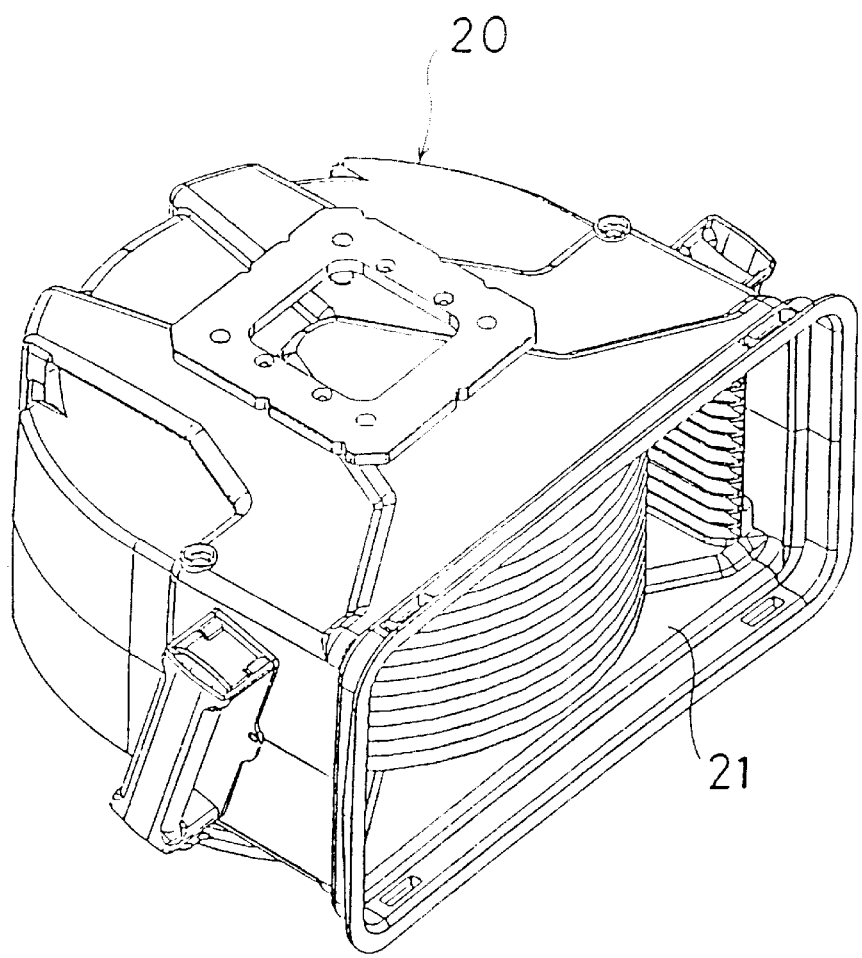
FIG. 6 is a front sectional view to show the conventional transfer box for semiconductors of the side open type using the mechanical seal.

(4) In the case of the conventional clean box 1 of FIG. 5, the system is constructed with the mechanism for further mounting the lid chuck 4 on the bottom lid 3, and thus the mechanism on the vacuum changer side is complicated; in contrast, the mechanism on the vacuum changer 50 side is simple in the present embodiment (because only the up-and-down mechanism of the additional lid 36 is needed).

The above embodiment illustrated the example in which the intake/exhaust port 34 used for the evacuation of the inside of the annular groove 33 for suction was provided in the bottom surface of the box body 31, but it can also be contemplated that the intake/exhaust port 34 is formed in one surface except for the surface in which the side aperture 32 is provided, without having to be limited to the bottom surface, and it is hermetically sealed by the additional lid 36.

Further, the mechanism for opening or closing the gate aperture 42 of the clean room 40 by the gate valve 43 can be constructed not only using the cylinder, but also using a configuration with a link mechanism or the like as occasion may demand.

The embodiments of the present invention have been described above and it is apparent to those skilled in the art that the present invention is not limited to the embodiments but can embrace various modifications and changes included within the spirit and scope of the appended claims.

As described above, the present invention can realize the clean box of the side open type in the simple structure capable of transferring the objects to be transferred in the sealed state with the clean gas, without use of the mechanical seal employed in the conventional products, and can overcome the drawbacks in use of the mechanical seal. Since the present invention employs no mechanical seal, connection or disconnection of the clean box is also easy to or from the gate aperture of the clean room.

What is claimed is:

1. A clean box comprising:
   a box body having an aperture in one side surface, an annular groove for suction formed in said one side surface so as to surround the aperture, and an intake/exhaust port in communication with said annular groove for suction in another surface;
   a side lid arranged to hermetically cover said annular groove for suction to form a space for suction while being mounted on the box body, said side lid being sucked to the box body by a pressure difference between inside and outside the space for suction to hermetically close said aperture; and
   an additional lid for hermetically closing said intake/exhaust port by a pressure difference between inside and outside thereof.

2. A clean transfer method using a clean box comprising a box body, said box body having an aperture in one side surface, an annular groove for suction formed in said one side surface so as to surround the aperture, and an intake/exhaust port in communication with said annular groove for suction in another surface; a side lid arranged to hermetically cover said annular groove for suction to form a space for suction while being mounted on the box body, said side lid being sucked to the box body by a pressure difference between inside and outside the space for suction to hermetically close said aperture; and an additional lid for hermetically closing said intake/exhaust port by a pressure difference between inside and outside thereof,
   said clean transfer method comprising steps of hermetically connecting said clean box to a gate aperture of a clean device, the gate aperture being formed in a side wall surface of the clean device and being hermetically closed by a gate valve; evacuating a hermetically closed space outside the box body, including said additional lid, by a vacuum changer to cancel the pressure difference between inside and outside of said additional lid and opening said intake/exhaust port to turn said space for suction into the atmospheric pressure through said intake/exhaust port; thereafter drawing the side lid into said clean device while holding said side lid by said gate valve to establish communication between an inside space of said clean box and the inside of said clean device; and transferring objects to be transferred between said clean box and said clean device.

3. The clean transfer method according to claim 2, wherein from the communication state between the inside space of said clean box and the inside of said clean device said side lid is held by said gate valve so as to hermetically close said aperture, thereafter said space for suction is evacuated through said intake/exhaust port by said vacuum changer, thereafter said intake/exhaust port is hermetically closed by said additional lid, and the hermetically closed space outside the box body, including said additional lid, is turned into the atmospheric pressure.

4. A clean transfer apparatus comprising:
   a clean box comprising a box body, said box body having an aperture in one side surface, an annular groove for suction formed in said one side surface so as to surround the aperture, and an intake/exhaust port in communication with said annular groove for suction in another surface; a side lid arranged to hermetically cover said annular groove for suction to form a space for suction while being mounted on the box body, said side lid being sucked to the box body by a pressure difference between inside and outside the space for suction to hermetically close said aperture; and an additional lid for hermetically closing said intake/exhaust port by a pressure difference between inside and outside thereof;
   a clean device having a gate aperture formed in a side wall surface thereof and a gate valve capable of opening or closing said gate aperture and capable of holding the side lid of the clean box connected to the gate aperture; and
   a vacuum changer for evacuating a hermetically closed space outside the box body, including the additional lid of the clean box connected to said gate aperture,
   wherein in a state in which said vacuum changer cancels the pressure difference between inside and outside of said additional lid and opens said intake/exhaust port to turn said space for suction into the atmospheric pressure through said intake/exhaust port, said side lid is drawn into said clean device while being held by said gate valve, to establish communication between an inside space of said clean box and the inside of said clean device.

5. The clean transfer apparatus according to claim 4, wherein said vacuum changer has a box holding member constructed in such structure that a vacuum suction passage for suction of said box body is formed in an opposite surface thereof to said box body and wherein said hermetically closed space is formed inside said box holding member.

6. The clean transfer apparatus according to claim 5, wherein said vacuum changer has a lid receiver for receiving said additional lid separated from said box body, inside said box holding member, said lid receiver being movable.

7. A clean box comprising:
   a box body having an aperture in one surface;
   a lid for hermetically closing the aperture of the box body;
   an annular suction space surrounding said aperture, defined by a surface of the box body facing the lid and a surface of the lid facing the box body under a state in which the box body is closed by the lid; and
   a closable port in communication with said suction space for evacuation of said suction space,
   wherein said lid is to be sucked to the box body by a pressure difference between the suction space and the outside of the clean box.

8. A container comprising:
   a container body having an aperture;
   a lid for hermetically closing the aperture of the container body;
   an annular suction space surrounding said aperture, defined by a surface of the container body facing the lid and a surface of the lid facing the container body under a state in which the container body is closed by the lid; and
   a closable port in communication with said suction space for evacuation of said suction space,
   wherein said lid is to be sucked to the container body by a pressure difference between the suction space and the outside of the container.

9. A method of sealing a clean box comprising:
   preparing a clean box including a box body having an aperture in one surface, a lid for hermetically closing the aperture of the box body, an annular suction space surrounding said aperture defined by a surface of the box body facing the lid and a surface of the lid facing the box body under a state in which the box body is closed by the lid, and a closable port in communication with said suction space for evacuation of said suction space; and evacuating said suction space through said port under the state in which said box body is closed by said lid so that said lid is sucked to the box body by a pressure difference between the suction space and the outside of the clean box.

10. A method of sealing a container comprising:

preparing a container including a container body having an aperture, a lid for hermetically closing said aperture, an annular suction space surrounding said aperture defined by a surface of the container body facing the lid and a surface of the lid facing the container body under a state in which the container body is closed by the lid, and a closable port in communication with said suction space for evacuation of said suction space; and evacuating said suction space through said port under the state in which said container body is closed by said lid so that said lid is sucked to the container body by a pressure difference between the suction space and outside of the container.

11. A clean box comprising:

a box body having an aperture in one surface;

a lid for hermetically closing the aperture of the box body;

an annular suction space surrounding said aperture, formed in at least one of the box body and the lid; and a closable port in communication with said suction space for evacuation of said suction space, wherein said lid is to be sucked to the box body by a pressure difference between the suction space and outside of the clean box.

12. A container comprising:

a container body having an aperture;

a lid for hermetically closing the aperture of the container body;

an annular suction space surrounding said aperture, formed in at least one of the container body and the lid under a state in which the container body is closed by the lid; and a closable port in communication with said suction space for evacuation of said suction space, wherein said lid is to be sucked to the container body by a pressure difference between the suction space and outside of the container.

13. A method of sealing a clean box comprising:

preparing a clean box including a box body having an aperture in one surface, a lid for hermetically closing the aperture of the box body, and annular suction space surrounding said aperture formed in at least one of the box body and the lid under a state in which the box body is closd by the lid, and a closable port in communication with said suction space for evacuation of said suction space; and evacuating said suction space through said port under the state in which said box body is closed by said lid so that said lid is sucked to the box body by a pressure difference between the suction space and the outside of the clean box.

14. A method of sealing a clean box comprising:

preparing a container including a container body having an aperture, a lid for hermetically closing said aperture, an annular suction space surrounding said aperture formed in at least one of the container body and the lid under a state in which the container body is closed by the lid, and a closable port in communication with said suction space for evacuation of said suction space; and evacuating said suction space through said port under the state in which said container body is closed by said lid so that said lid is sucked to the container body by a pressure difference between the suction space and outside of the container.

* * * * *

UNITED STATES PATENT AND TRADEMARK OFFICE
CERTIFICATE OF CORRECTION

PATENT NO.   : 6,561,894 B1
DATED        : May 13, 2003
INVENTOR(S)  : Miyajima

It is certified that error appears in the above-identified patent and that said Letters Patent is hereby corrected as shown below:

<u>Title page,</u>
The CPA information has been omitted and the Notice information should read as follows:

-- [*] Notice:   This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer. --

Signed and Sealed this

Twenty-sixth Day of August, 2003

JAMES E. ROGAN
*Director of the United States Patent and Trademark Office*